US010134451B1

(12) United States Patent
Sartore et al.

(10) Patent No.: US 10,134,451 B1
(45) Date of Patent: *Nov. 20, 2018

(54) ADAPTIVE TRAINING AND ADJUSTMENT TO CHANGING CAPACITOR VALUES BASED UPON AGE AND USAGE BEHAVIOR (71) Applicant: AgigA Tech Inc., San Diego, CA (US)

(72) Inventors: Ronald H. Sartore, Poway, CA (US); Yingnan Liu, San Diego, CA (US); Lane Hauck, San Diego, CA (US)

(73) Assignee: AgigA Tech Inc, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/786,526

(22) Filed: Oct. 17, 2017

Related U.S. Application Data

(63) Continuation of application No. 12/170,526, filed on Jul. 10, 2008, now Pat. No. 9,842,628.

(51) Int. Cl.
G01R 31/02 (2006.01)
G11C 5/14 (2006.01)
G11C 16/30 (2006.01)
G11C 16/22 (2006.01)
G11C 16/10 (2006.01)

(52) U.S. Cl.
CPC .............. G11C 5/143 (2013.01); G11C 16/10 (2013.01); G11C 16/225 (2013.01); G11C 16/30 (2013.01)

(58) Field of Classification Search
CPC .. G01R 27/2605; G01R 31/028; G01R 31/42; G01R 15/16; G01R 19/0084; G01R 27/02; G01R 29/12; G01R 31/02; G01R 31/025

USPC ..... 324/548, 382, 519, 750.17, 754.28, 658, 324/76.66

See application file for complete search history.

(56) References Cited

U.S. PATENT DOCUMENTS

| | | | |
|---|---|---|---|
| 3,916,390 A | 10/1975 | Chang et al. | |
| 4,039,898 A * | 8/1977 | Iwata | H05B 41/32 315/241 P |
| 4,965,828 A | 9/1990 | Ergott et al. | |
| 5,519,663 A | 5/1996 | Harper, Jr. | |
| 5,519,831 A | 5/1996 | Holzhammer | |
| 5,799,200 A | 8/1998 | Brant et al. | |
| 6,169,784 B1 * | 1/2001 | Smith | H04M 3/005 324/519 |
| 6,181,083 B1 * | 1/2001 | Moisin | H05B 41/2985 315/224 |
| 6,295,577 B1 | 9/2001 | Anderson et al. | |
| 6,336,174 B1 | 1/2002 | Li | |
| 7,069,401 B1 | 6/2006 | Noonan et al. | |
| 7,451,348 B2 | 11/2008 | Pecone et al. | |
| 7,464,240 B2 | 12/2008 | Caulkins et al. | |
| 7,592,775 B2 | 9/2009 | Altemose et al. | |
| 7,610,433 B2 | 10/2009 | Randell et al. | |
| 7,634,688 B2 | 12/2009 | Madter et al. | |
| 7,661,002 B2 | 2/2010 | Pecone et al. | |
| 7,830,732 B2 | 11/2010 | Moshayedi et al. | |
| 7,865,679 B2 | 1/2011 | Sartore | |
| 7,865,761 B1 | 1/2011 | Chilton | |
| 7,990,797 B2 | 8/2011 | Moshayedi et al. | |
| 8,040,750 B2 | 10/2011 | Cagno et al. | |

(Continued)

Primary Examiner — Jermele M Hollington
Assistant Examiner — Taqi Nasir
(74) Attorney, Agent, or Firm — FSP LLC (57) ABSTRACT

An apparatus includes logic to determine a discharge drop of a capacitor and to adjust an enablement charge level of the capacitor according to the discharge drop.

2 Claims, 4 Drawing Sheets

(56) References Cited

U.S. PATENT DOCUMENTS

| | | | |
|---|---|---|---|
| 2001/0055234 A1 | 12/2001 | Mori | |
| 2002/0049917 A1 | 4/2002 | Portman et al. | |
| 2002/0191471 A1 | 12/2002 | Caulkins | |
| 2003/0095463 A1 | 5/2003 | Shimada et al. | |
| 2003/0141856 A1* | 7/2003 | Kimura | H02M 1/32 323/282 |
| 2004/0030852 A1 | 2/2004 | Coombs et al. | |
| 2004/0103238 A1 | 5/2004 | Avraham et al. | |
| 2004/0158674 A1 | 8/2004 | Cloutier et al. | |
| 2005/0283648 A1 | 12/2005 | Ashmore | |
| 2006/0015683 A1 | 1/2006 | Ashmore et al. | |
| 2006/0072369 A1 | 4/2006 | Madter et al. | |
| 2006/0198198 A1 | 9/2006 | Fujita et al. | |
| 2006/0212651 A1 | 9/2006 | Ashmore et al. | |
| 2007/0033431 A1 | 2/2007 | Pecone et al. | |
| 2007/0033432 A1 | 2/2007 | Pecone et al. | |
| 2007/0033433 A1 | 2/2007 | Pecone et al. | |
| 2007/0136523 A1 | 6/2007 | Bonella et al. | |
| 2007/0248487 A1* | 10/2007 | Kay | C02F 1/325 422/24 |
| 2007/0276995 A1 | 11/2007 | Caulkins et al. | |
| 2008/0046638 A1 | 2/2008 | Maheshwari et al. | |
| 2008/0282023 A1 | 11/2008 | Biswas et al. | |
| 2008/0303488 A1 | 12/2008 | Khan | |
| 2009/0027014 A1 | 1/2009 | Sartore | |
| 2009/0066291 A1* | 3/2009 | Tien | H02J 7/0016 320/118 |
| 2009/0108681 A1* | 4/2009 | Litovsky | H03F 1/0238 307/110 |
| 2010/0308650 A1* | 12/2010 | Perseval | H02J 7/1423 307/10.1 |
| 2010/0329064 A1 | 12/2010 | Wilson | |
| 2010/0332896 A1* | 12/2010 | Wilson | G06F 1/30 714/14 |
| 2011/0175587 A1* | 7/2011 | Hosotani | H02M 3/33515 323/283 |
| 2013/0033914 A1* | 2/2013 | Yahata | H02M 7/48 363/132 |
| 2013/0188283 A1 | 7/2013 | Midholm et al. | |
| 2015/0002876 A1* | 1/2015 | Ghimire | G06K 15/4055 358/1.13 |
| 2016/0124027 A1* | 5/2016 | Sambucco | G01R 19/0092 324/76.11 |

* cited by examiner

ADAPTIVE TRAINING AND ADJUSTMENT TO CHANGING CAPACITOR VALUES BASED UPON AGE AND USAGE BEHAVIOR

This application claims priority and benefit as a continuation of U.S. patent application Ser. No. 12/170,526, entitled "CAPACITOR ENABLEMENT VOLTAGE LEVEL ADJUSTMENT METHOD AND APPARATUS", filed on Jul. 10, 2008 and incorporated herein by reference in its entirety.

TECHNICAL FIELD

The present disclosure relates to devices and circuits that employ stored energy in a capacitor to perform operations.

BACKGROUND

Super capacitors (high capacitance devices in a smaller form factor) are a relatively new technology. Their large capacitance value makes it possible to use them as energy sources in applications that typically would have involved the use of chemical batteries. For example, super capacitors may be used to power memories and logic that moves the contents of a volatile RAM into a nonvolatile memory during a power failure or system shutdown.

Current designs employing super capacitors use a fixed approach, that is, a capacitor value is selected that is adequate over the product's life, regardless of degradation of the capacitance value. Super capacitors have an observed behavior of substantial reduction in value after repeated charging and discharging cycles. Because of this, either a larger value than initially required is selected, or the possibility of a failure later in a product's life is possible. Super capacitors also degrade due to other factors such as elevated temperature. Because of this a higher capacitance value is initially required in a product's life in order to compensate for the expected reduction in capacitance as the product ages.

Having a larger capacitance initially than what is actually required has a negative effect—it takes longer to charge to the usable voltage and thus delays the ability to permit operation of the device that is powered or potentially powered by the capacitor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Hybrid Memory Subsystem

Figure 1:
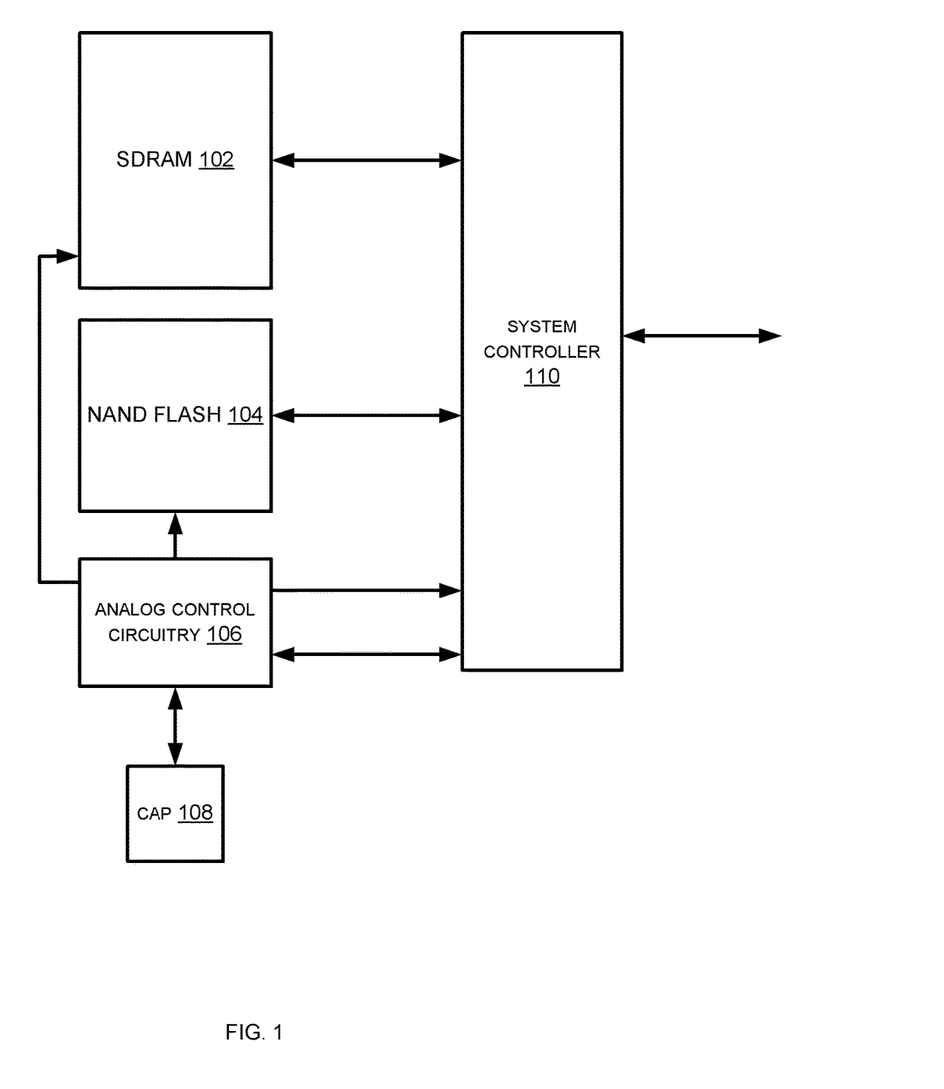
FIG. 1 is a block diagram of an embodiment of a hybrid memory subsystem.

FIG. 1 is a block diagram of an embodiment of a hybrid memory subsystem. The system exemplifies a situation in which a capacitor may be used to power certain device operations in the event of primary power failure. The subsystem provides a low-cost, high density, non-volatile memory by using a low-cost volatile random access memory 102 in conjunction with a low-cost non-volatile bulk or block accessed memory 104.

The memory subsystem includes, but may not be limited to, SDRAM 102 (volatile memory), NAND FLASH 104 (nonvolatile memory), analog power control circuitry 106, power capacitor 108, and a system controller 110. Other elements and/or couplings among the elements may be apparent to skilled practitioners in the relevant art(s).

The volatile memory in this embodiment is an SDRAM 102 (Synchronous Dynamic Random Access Memory). Other types of volatile random access memory may also be used. The nonvolatile memory in this embodiment is a NAND FLASH 104, and again, other types of nonvolatile memory may be used.

The analog power control circuitry 106 interfaces the memory subsystem to an external power source, typically the power source of a larger system that incorporates and uses the hybrid memory subsystem. For example, the external power source may be the power of personal or business computer system that incorporates the memory subsystem.

The analog power control circuitry 106 also interfaces the memory subsystem to a backup power source that is local to the memory subsystem. The backup power source may be, for example, a capacitor 108 or small battery (or a combination of the two). In the embodiment of FIG. 1, a capacitor 108 provides power to the memory subsystem for a temporary time when external power fails. The capacitor 108 may provide power for long enough to copy data blocks from volatile memory 102 to nonvolatile memory 104.

In the event of an external power failure, the hybrid memory subsystem may operate as an isolated subsystem of the larger, external system. The analog power circuitry 106 may recognize that external system power has failed. The system controller 110 may then initiate backup of data currently stored in the volatile memory 102 into the non-volatile memory 104. Herein, the term "backup" means that data of the volatile memory 102 is stored into the nonvolatile memory 104. Upon restoration of external system power, the system controller 110 may initiate restoration of backed-up data from non-volatile memory 104 to volatile memory 102. Herein, the term "restore" and "restoration" means that data of the nonvolatile memory 104 is stored into the volatile memory 102.

The system controller 110 may thus include logic to backup data from volatile memory 102 to nonvolatile memory 104 when the external power source fails, and to restore data from nonvolatile memory 104 to volatile memory 102 when the external power source becomes available.

Those skilled in the art will appreciate that various functional components, such as the power controller logic 106 and the system controller logic 110, and even the volatile memory 102 and nonvolatile memory 104, may in fact be implemented together as one or more integrated circuit devices, and packaged as one or more discrete physical components.

Data stored within the hybrid memory subsystem persists even when the power of the external system fails. The external system may interact with the hybrid memory subsystem as though interacting with volatile memory 102 (of the same or another type), even though, transparently, the data is stored internally by the memory subsystem in non-volatile memory 104 persistently in the absence of external system power.

The hybrid memory system may write data to non-volatile memory 104 only in the event that external system power fails. Thus, the non-volatile memory 104 undergoes many fewer write cycles than would occur if it were being written every time data were written to the hybrid memory subsystem. When the non-volatile memory 104 is a low-cost, limited duty cycle NAND FLASH, the result in an extension of the useful lifetime of the non-volatile memory 104.

The system controller 110 provides a memory interface to the external system. The memory interface may comprise a standard data and control interface for some particular kind of volatile memory. For example, the system controller may provide an SDRAM data, address, and control interface to the external system. The interface provided to the external system may or may not be the interface for the type of volatile memory 102 actually used by the memory subsystem.

The system controller 110 may additionally provide an interface whereby the external system may send commands to the hybrid memory subsystem or obtain status. For example, in some embodiments the external system may command the hybrid memory subsystem to initiate a backup of data from volatile memory 102 to non-volatile memory 104, even though the system power is still available. Additionally or alternatively, the hybrid memory subsystem or external system may provide a direct user interface, such as a switch or control on a graphic user interface, whereby a user of the external system may directly initiate a copy of data from volatile 102 to non-volatile memory 104. Another action which may in some embodiments be initiated either through the system interface of the system controller 110, or directly by a user, is restoring data from non-volatile memory 104 to volatile memory 102. In some embodiments the external system may use its system interface to the hybrid memory controller 110 to initiate a self test of the hybrid memory subsystem.

Other examples and/or embodiments of the various system components may now be apparent to skilled practitioners in the relevant art(s).

System Operation With Power Capacitor

As previously described, the system controller 110 may comprise logic to interface the volatile memory 102 to an external system, such as a personal computer system or a business computer system. Other examples of applications of the hybrid memory subsystem are embedded control applications, communications, and consumer products.

The system controller 110 may present an interface to the external system, so that the volatile memory 102 is addressable for reading and writing of data by the external system.

Logic of the power controller 106 may detect when power from the external system to at least one of the volatile and nonvolatile memories and to the controller fails. For example, the external system may suffer a power source outage or battery failure. When external system power fails, the power controller 106 may provide backup power to the volatile memory 102, nonvolatile memory 104, and to the controller 110 for long enough to enable the backup of data from the volatile memory 102 to the nonvolatile memory 104. The capacitor 108 may act as the source of this backup power.

In some embodiments, the controller 110 may include logic to enable the external system to initiate a backup of data from the volatile memory 102 to the nonvolatile memory 104, instead of waiting for a power failure to initiate the backup. The controller 110 may also comprise logic to emulate to the external system a type of volatile memory other than a type of the volatile memory. For example, internally the memory subsystem may employ SDRAM for the volatile memory 102. However, the controller may include logic to emulate single data rate RAM (SDRAM), double data rate RAM (DDRAM), DDR2, asynchronous SRAM, C-F card, or PCI-Express (among other examples) to the external system.

The volatile memory 102, nonvolatile memory 104, controller 110, and power controller 106 may implemented in various ways. For example, these components may be implemented as one of a multi-chip set, a board subsystem, or even a single chip.

The embodiment shown in FIG. 1 shows that backups and restores of data are implemented as data moves from the volatile memory 102 to the nonvolatile memory 104, and vice versa, via the controller 110. In other embodiments, backups and restores may be implemented via data moves from the volatile memory 102 to the nonvolatile memory 104 directly, without passing through the controller 110.

Figure 2:
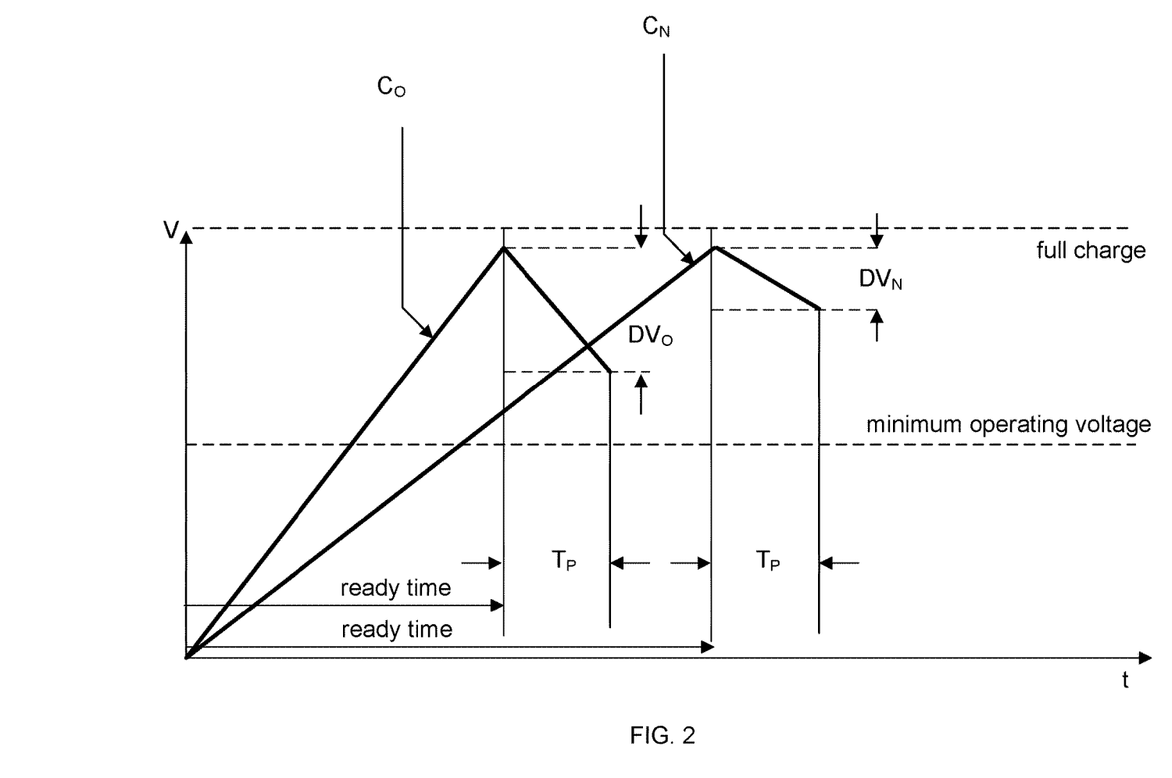
FIG. 2 is an illustration of exemplary charging characteristics for a capacitor capable of storing and delivering a substantial quantity of charge, such as the capacitor in the hybrid memory system embodiment of FIG. 1.

FIG. 2 shows simplified charging characteristics for a capacitor capable of storing and delivering a substantial quantity of charge, such as the capacitor 108 in the hybrid memory system embodiment of FIG. 1. Such a capacitor is sometimes referred to as a super capacitor. In FIG. 2, the characteristic line labeled $C_O$ represents an exemplary charging characteristic for a super capacitor nearing the end of its useful commercial life. The characteristic line labeled $C_N$ represents an exemplary charging characteristic of a capacitor that is relatively new. The newer capacitor has a greater capacitance and thus for the same applied voltage and/or current will charge more slowly than the older capacitor. The older capacitor, having lost some capacitance over its commercial life, charges more quickly, but also discharges more quickly and more deeply when employed as a power source than a newer capacitor.

For example, a power operation that the capacitor is called upon to perform may take a time T. During this powering time, a newer capacitor may discharge an amount of voltage $DV_N$. During the same time for the same powering operation, an older capacitor may discharge an amount of voltage $DV_O$, which is significantly greater that $DV_N$.

There are various approaches to dealing with the loss of capacitance by a capacitor during its commercial use. The capacitor may be charged to a voltage level significantly greater than that which will be needed to perform the powering operations for which the capacitor is to be employed. This is the approach illustrated in FIG. 2, in which a set voltage is selected and, prior to enabling the capacitor for use in power operations, the capacitor is charged to that voltage regardless of its discharge drop. The preset voltage at which enablement occurs is selected so that the discharge drop is accounted for even as the capacitor ages. One drawback of this approach is that it requires a potentially larger and more expensive capacitor. Another drawback is that the preset voltage at which enablement occurs is unnecessarily high early in the capacitor's life. Applications that require power from the capacitor must wait until the capacitor is charged to the preset voltage before being initiated. This may delay the starting of the operations powered by the capacitor more than is necessary.

In some cases, the preset voltage may simply be the full charge that the capacitor can hold. Again, this causes unnecessary delays and overdesign.

Figure 3:
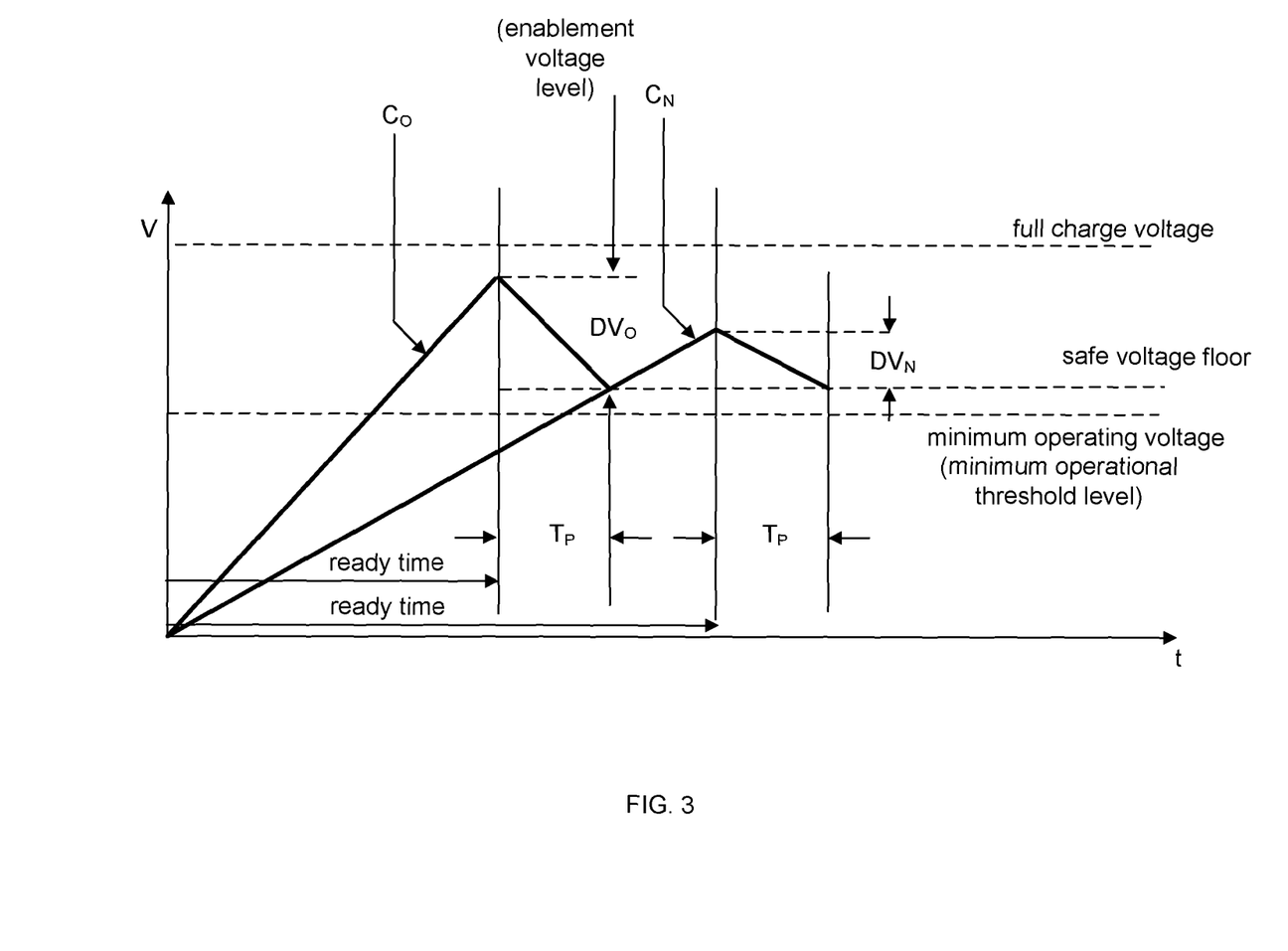
FIG. 3 is an illustration of exemplary charging characteristics of a capacitor in which the voltage to which the capacitor is charged is varied to take into account the faster discharge that will occur when the capacitor nears its end of useful life.

Another approach, which is shown in FIG. 3, is to vary the voltage to which the capacitor is charged before enablement (i.e., the "enablement charge level") to take into account the faster discharge that will occur when the capacitor nears its end of useful life. The enablement voltage (i.e., the "enablement charge level") chosen is typically somewhat or slightly less than the fully charged voltage of the capacitor. Until the capacitor charges to this voltage, it will not be enabled to power the system. The upper voltage is selected so that if capacitor is used to power the system, the resulting discharge will not cause the voltage of the capacitor to drop below a minimum operating voltage. Once the charge on the capacitor reaches the enablement (upper) voltage, it may continue to charge to an even higher voltage, depending on the implementation. This may provide an even greater operating margin without delaying the point at which the capacitor is enabled for use in powering system features.

In some cases, a safe voltage floor that is slightly above the minimum operating voltage may be determined. The upper (enablement) voltage is then selected so that if capacitor is used to power the system, the resulting discharge will not cause the voltage of the capacitor to drop below the safe voltage floor.

As the capacitor ages, and thus discharges more quickly while powering system operations, the upper (enablement) voltage may be adjusted dynamically to account for the loss of capacitance (which leads to a more precipitous discharge drop). Determination of the upper voltage may be accomplished in a number of ways, such as by measuring the discharge drop when the capacitor is used to power system functions, and adjusting the upper voltage so that this drop does not cause the voltage to drop below the minimum or safe voltage levels. Again, in some implementations the capacitor may continue to charge beyond the enablement voltage.

Using the approach shown in FIG. 3, the capacitor is enabled for powering system features before charging significantly more than is necessary at any point during its operating lifetime. The enablement voltage for the capacitor is dynamically adjusted as the capacitor ages, so that the capacitor is always charged to a voltage with sufficient discharge leeway. The capacitor is enabled at a lower voltage early in its life, when its capacitance is highest and its discharge drop is lower. The capacitor is enabled at a higher voltage later in its life, when its capacitance is lowest and its discharge drop is higher. In either case, the time to enable the capacitor for powering system features is not unnecessarily extended.

To summarize, super capacitors may substantially change (decrease) in capacitance value after repeated use. Super capacitors have conventionally been used with initial capacitance values that are, for example, 20% higher than what is needed early in a product's life. A super capacitor's capacitance may, for example, decrease a total of 40% over a product's life (+/−20 to 30% of nominal).

Hybrid RAM applications that employ super capacitors to save data during a power loss typically wait until the capacitor is fully charged before allowing RAM data to be operational to a host system. Nominal capacitor values in these applications have conventionally been chosen for worst case operation at the capacitor's end of life, and are thus much larger than what is actually needed early in the system's life. Larger than needed capacitors delay the start time for the system to becoming operational.

Figure 4:
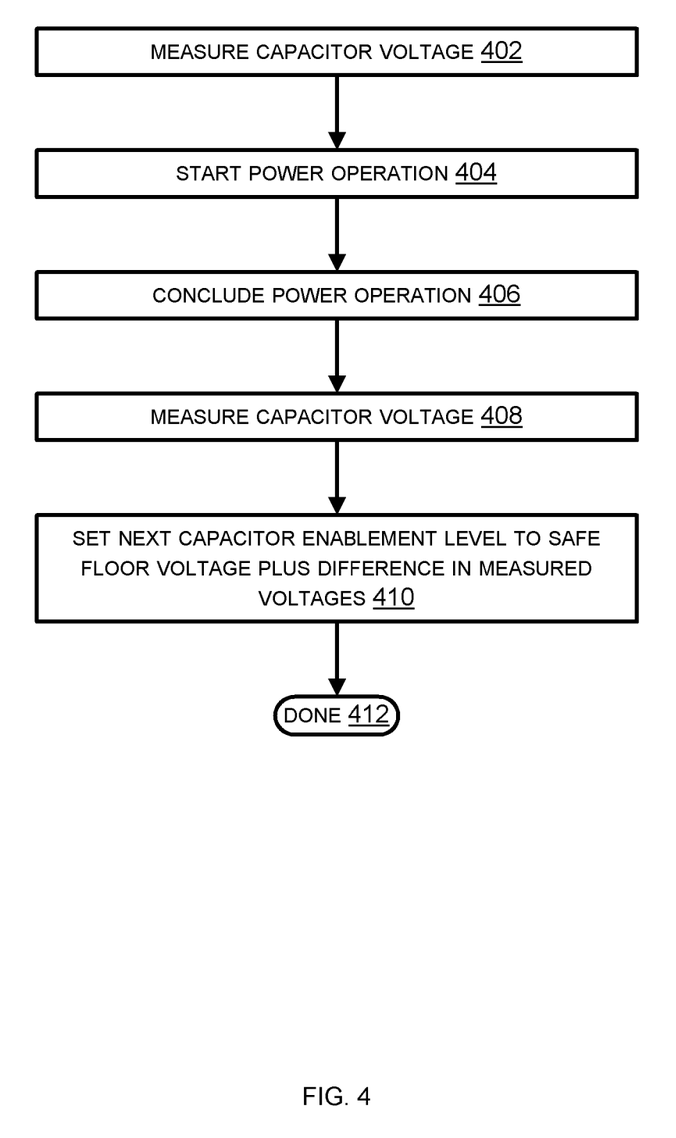
FIG. 4 is a flow chart of an embodiment of a process of adjusting an enablement time/voltage for a power capacitor.

FIG. 4 is a flow chart of an embodiment of a process of adjusting a charging time for a power capacitor. A power operation powered by the capacitor is started and concluded (404, 406). The capacitor voltage is measured both before and after a power operation (402, 408). The voltage level to which the capacitor should be charged before being enabled to power system features is then determined to be a safe floor voltage (or minimum operating voltage) plus the difference in the measured voltages. Thus, as the capacitor ages and the voltage drop to accomplish power operations increases, the enablement voltage level for the capacitor will increase so that the discharge drop is always accounted for, without unnecessarily extending the start-up time to use the capacitor, or overdesigning with too large of a capacitance value.

The capacitor may, in some implementations, continue to charge beyond the enablement voltage, providing additional operating margin without unduly delaying enablement of the capacitor as a power source.

Profiling a capacitor may take place after the capacitor is installed in an actual device. In other words, the discharge drop of each capacitor may be measured during actual use conditions of the capacitor over its lifetime. Alternatively, a capacitor of the type that will be used may be profiled in a non-field environment, and the discharge rates noted over the life of the capacitor. Logic may then be included in devices that include similar capacitors, to adjust the enablement level of the capacitors according to the discharge amounts noted in the non-field environment.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. An apparatus comprising:
   a controller;
   at least one capacitor; and
   at least one of non-transitory machine memory and circuits comprising logic that when executed by the controller:
      measures a first voltage of the at least one capacitor;
      begins an operation to at least partially discharge the at least one capacitor;
      concludes the operation to at least partially discharge the at least one capacitor;
      measures a second voltage of the at least one capacitor at the conclusion of the operation to at least partially discharge the at least one capacitor;
      determines a time interval for the operation to at least partially discharge the at least one capacitor;
      sets an enablement voltage level for the at least one capacitor based on a rate determined from the first voltage, the second voltage, and the time interval; and
      wherein the enablement voltage level is a voltage level the at least one capacitor must charge to before the apparatus enables the at least one capacitor to be used as a power source for a memory backup operation.

2. A hybrid memory module, comprising:
   a controller;
   a volatile memory;
   a non-volatile memory;
   at least one capacitor; and
   at least one of non-transitory machine memory and circuits comprising logic that when executed by the controller:
      measures a first voltage of the at least one capacitor;
      begins an operation to at least partially discharge the at least one capacitor;

concludes the operation to at least partially discharge the at least one capacitor;

measures a second voltage of the at least one capacitor at the conclusion of the operation to at least partially discharge the at least one capacitor;

determines a time interval for the operation to at least partially discharge the at least one capacitor;

sets an enablement voltage level for the at least one capacitor based on a rate determined from the first voltage, the second voltage, and the time interval; and wherein the enablement voltage level is a voltage level the at least one capacitor must charge to before the apparatus enables the at least one capacitor to be used as a power source for a memory backup operation.

* * * * *